United States Patent [19]

Kodama et al.

[11] Patent Number: 4,744,052
[45] Date of Patent: May 10, 1988

[54] HYBRID MAGNETIC BUBBLE MEMORY DEVICE

[75] Inventors: Naoki Kodama, Tachikawa; Takashi Toyooka, Sayama; Teruaki Takeuchi, Kokubunji; Masatoshi Takeshita; Ryo Suzuki, both of Hachioji; Shinzo Matsumoto, Mobara, all of Japan

[73] Assignee: Hitachi, Ltd., Tokyo, Japan

[21] Appl. No.: 878,248

[22] Filed: Jun. 25, 1986

[30] Foreign Application Priority Data

Jul. 3, 1985 [JP] Japan ............................... 60-144599
Feb. 17, 1986 [JP] Japan ................................. 61-30836

[51] Int. Cl.$^4$ .......................................... G11C 19/08
[52] U.S. Cl. ..................................................... 365/36
[58] Field of Search ............................ 365/36, 15, 16

[56] References Cited

U.S. PATENT DOCUMENTS

| | | | |
|---|---|---|---|
| 4,525,808 | 6/1985 | Kodama et al. | 365/36 |
| 4,528,645 | 7/1985 | Sugita et al. | 365/36 |
| 4,561,069 | 12/1985 | Satoh et al. | 365/36 |

FOREIGN PATENT DOCUMENTS

| | | | |
|---|---|---|---|
| 0164082 | 9/1983 | Japan | 365/36 |
| 0117483 | 6/1985 | Japan | 365/36 |

Primary Examiner—James W. Moffitt
Attorney, Agent, or Firm—Antonelli, Terry & Wands

[57] ABSTRACT

A hybrid magnetic bubble memory device includes, magnetic bubble propagation tracks formed of partial ion-implantation and bubble propagation tracks formed of a soft magnetic material pattern. At least one of the junctions between the two type tracks is located on a corner soft magnetic material pattern where the bubble propagation direction is changed, and the hairpin conductor is superposed on the part of the corner pattern under which the magnetic material is not ion-implanted to form ion-implanted propagation tracks.

10 Claims, 5 Drawing Sheets

HYBRID MAGNETIC BUBBLE MEMORY DEVICE

BACKGROUND OF THE INVENTION

The present invention relates to a hybrid magnetic bubble memory device in which magnetic bubble propagation tracks formed of an ion-implanted layer and magnetic bubble propagation tracks formed of a soft magnetic material film (for example, a nickel-iron alloy film such as permalloy film) are both provided on a single chip including a magnetic medium for supporting a magnetic bubble, and more particularly to the junctions of the two magnetic bubble propagation tracks.

The hybrid magnetic bubble memory device was disclosed in a Japanese Patent Application Laid-Open No. 40971/1982, laid-open on May 6, 1982, the application filed in the name of Fujitsu, Ltd. and a U.S. application Ser. No. 375,344 (a U.S. Pat. No. 4,528,645 filed on May 5, 1982 (Priority date May 11, 1981)), the application filed in the name of Hitachi, Ltd. In the hybrid magnetic bubble memory device, ion-implanted tracks are used in data storage area for increasing the bit density and soft magnetic material tracks are used in functional parts such as generators, replicate gates, swap gates, read major lines and write major lines for stable function operations. The hybrid architecture is applicable to magnetic bubble memory devices of which bubble diameter is larger than 0.6 μm where soft magnetic material tracks have good bubble propagation characteristics. The architecture realizes 4~16 Mb/cm² magnetic bubble memory devices having good read/write functional characteristics.

Figure 2:
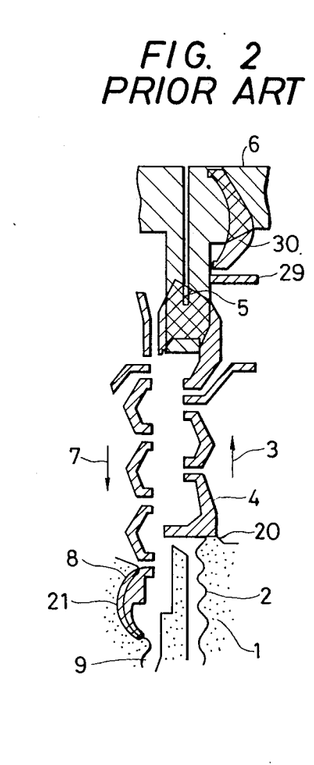
FIG. 2 is schematic view of the conventional replicate gate corner pattern, junctions, several soft magnetic patterns and ion-implanted tracks in minor loops.
Figure 3:
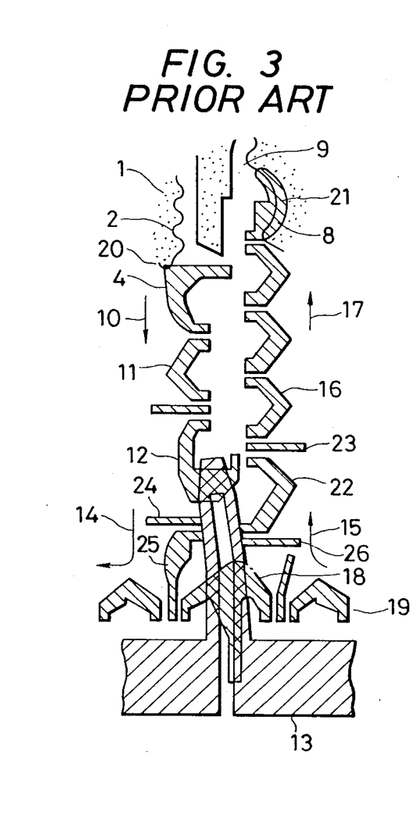
FIG. 3 is schematic view of the conventional swap gate corner pattern, junctions, several soft magnetic patterns and ion-implanted tracks in minor loops.

In the hybrid magnetic bubble memory devices, ion-implanted tracks are superposed on soft magnetic material tracks in minor loops to form junctions where bubbles propagate from ion-implanted tracks to soft magnetic material tracks and from soft magnetic material tracks to ion-implanted tracks. Conventional junction designs are shown in FIGS. 2 and 3. Bubble propagation tracks near the replicate gate corner in minor loops are shown in FIG. 2. Ion-implanted tracks 2 are formed at the boundary of ion-implantation region 1 and non-implantation region.

In the following description and the foregoing, non-ion-implanted region means the region in which ion-implantation to form ion-implanted tracks is not effected. Ion-implantation mask is used to form the non-ion-implanted region on ion-implantation process. Such ions are $H_2^+$, $He^+$ and $Ne^+$ are implanted all the surface of the memory device to suppress the generation of hard bubbles. In the non-ion-implanted region, ions for hard bubble suppression are implanted. Bubbles are propagated along the upper direction 3 on the ion-implanted tracks 2 and transferred to the soft magnetic pattern 4, and propagated along the soft magnetic patterns in the direction 3. A soft magnetic pattern 5 and a conductor pattern 6 form a replicate gate.

The replicate gate has a function to divide a bubble into two bubbles by pulsed current drive of the conductor pattern 6.

After the corner pattern 5 propagation, bubbles are propagated along the direction 7 to reach the other junction 8 where ion-implanted tracks 9 are superposed with a soft magnetic pattern 8.

At the junction 21, bubbles are propagated from soft magnetic tracks to ion-implanted tracks.

After all, the soft magnetic pattern 4 and ion-implanted track 2 form the type I junction 20 in which bubbles are propagated from the ion-implanted tracks to the soft magnetic tracks. The soft magnetic pattern 8 and ion-implanted track 9 form the type II junction 21 in which bubbles are propagated from the soft magnetic tracks to ion-implanted tracks.

Bubble propagation tracks near the swap gate corner in the minor loop is shown in FIG. 3. The type I junction and the type II junction are arranged in the reverse direction. Bubbles are propagated on the ion-implanted tracks 2 in the direction 10 and are transferred to the soft magnetic pattern 4 at the type I junction 20. Then propagated along the soft magnetic track to reach the swap gate corner pattern 12. The conductor pattern 13, the corner pattern 12 and other several soft magnetic patterns 18, 22, 24, 25 and 26 form the swap gate. Pulsed current drive of the conductor pattern 13 control the bubble in the minor loop to propagate along the direction 14 to the write major line 19. At the same time, the bubble on the write major line propagates along the direction 15 to the minor loop.

Bubbles, which propagate on the swap gate corner pattern 12 or which are transferred from the write major line 19 to the minor loop, then propagate on the soft magnetic patterns such as 16, in the direction 17 and reach the soft magnetic pattern 8 which is a component of the type II junction 21. On the soft magnetic pattern 8, bubbles are transferred from the soft magnetic track to the ion-implanted track 9. The period of the ion-implanted tracks in the minor loop as shown in FIG. 2 and FIG. 3 is 3 to 4 times of the bubble diameter. The period of the soft magnetic patterns which form the junctions, corner patterns and soft magnetic propagation patterns, is 10 to 20 times of the bubble diameter. Such large period patterns are used to increase drive force caused by rotating field Hr. of the small diameter bubbles which have large saturation induction Ms. Magnetization of the soft magnetic patterns due to the large bubble stray field which value is linear to Ms value. The smaller the bubble diameter, the larger the Ms value, which means the neccessity of large amplitude rotating field to drive small diameter bubbles. The increased period of the soft magnetic pattern enables the enlargement of bubble drive force, which results bubble propagation by low amplitude drive field. Minor loop length is enlarged by using 10 to 20 soft magnetic pattern having such a large period. The bit density of the magnetic bubble memory using ion-implanted tracks is reduced by using such enlarged soft magnetic patterns. Therefore, high density magnetic bubble memory device is realized by reducing the number of soft magnetic patterns having the enlarged period.

Another problem of the conventional hybrid magnetic bubble memory device is that the bubble drive force of the soft magnetic patterns is not large enough to propagate bubbles across the ion-implantation edges at the junctions for the lower drive field.

Therefore, the period of the soft magnetic pattern in the junction portion is set larger than that of the soft magnetic pattern in another portion.

For the drive field larger than 60 $\overline{\text{Oe}}$, bias margin width of the junction is larger than 10% of the operating bias field.

The value decreases as the drive field becomes smaller. For the 50 $\overline{\text{Oe}}$ drive field, the bias margin is smaller than 7~8% of the operating bias field.

The increase of the soft magnetic pattern period enables the increase of the bubble drive force, and the upper end of the bias margin is higher. As though, too much enlargement of the soft magnetic patterns induces the bubble propagation errors at lower bias field edge.

The attractive pole generated by the drive field on the large period soft magnetic patturn has larger area than that on the small period soft magnetic pattern.

Therefore, bubbles on the large period soft magnetic pattern strech to be strip domains at higher bias field than those on the small period soft magnetic pattern.

The lower end of the bias margin becomes higher as the soft magnetic pattern period is larger.

Therefore, period increase of the soft magnetic patterns in the junctions is not the solution to improve the bubble propagation characteristics of the junctions.

SUMMARY OF THE INVENTION

An object of the present invention is to provide a hybrid magnetic bubble memory device which includes magnetic bubble propagation tracks formed of ion-implantation and magnetic bubble propagation tracks formed of soft magnetic patterns, and which has smaller number of soft magnetic patterns having a large period to increase the bit density of the hybrid magnetic bubble device.

The other object of the present invention is to provide a hybrid magnetic bubble memory device which includes magnetic bubble propagation tracks formed of ion-implantation and magnetic bubble propagation tracks formed of soft magnetic patterns, and which includes junctions composed of large soft magnetic patterns having large bubble drive force and having good bubble propagation characteristics a lower bias field.

In order to attain the above-mentioned objects, according to the present invention, there is provided a hybrid magnetic bubble memory device including magnetic bubble propagation tracks formed of ion-implantation and magnetic bubble propagation tracks formed of soft magnetic patterns, where in at least one of the minor loop corners includes at least a corner soft magnetic pattern which is superposed on the ion-implanted tracks, where in at least a hairpin conductor pattern is superposed on/under the said corner soft magnetic pattern under which the said magnetic bubble film is not implanted by ions for forming bubble propagation tracks.

By forming the junction on the corner soft magnetic pattern superposed on the ion-implanted track, the number of soft magnetic patterns at the minor loop corner is reduced in comparison with the minor loop corner as shown in FIGS. 2 or 3, which reduces the minor loop length and realize a high density hybrid bubble memory device.

Another improvement of the present invention is in the bubble propagation characteristic at the junctions for lower drive field.

On the corner soft magnetic pattern, the radius of curvature of the soft magnetic pattern which is in the vicinity of the junction is reduced to enable the area of the bubble attractive poles in the vicinity of the junction to become smaller than that of the corresponding bubble attractive poles in the vicinity of the conventional junctions shown in FIG. 2 or FIG. 3.

As a result, an erroneous operation at the lower bias field, which is ascribed to the stretching bubble in the vicinity of the junctions on the soft magnetic patterns, can be prevented.

Using the large corner soft magnetic pattern having the small radials of curvature of the soft magnetic pattern in the vicinity of the junction, the bubble drive force of the soft magnetic pattern in the vicinity of the junctions is larger without inducing the erroneous operation at the low bias field region.

As is clearly understood from the above, if the present invention is used in a hybrid magnetic bubble memory devices the characteristics of the junctions can be improved to a great extent.

DESCRIPTION OF THE PREFERRED

EXAMPLE 1

Figure 1:
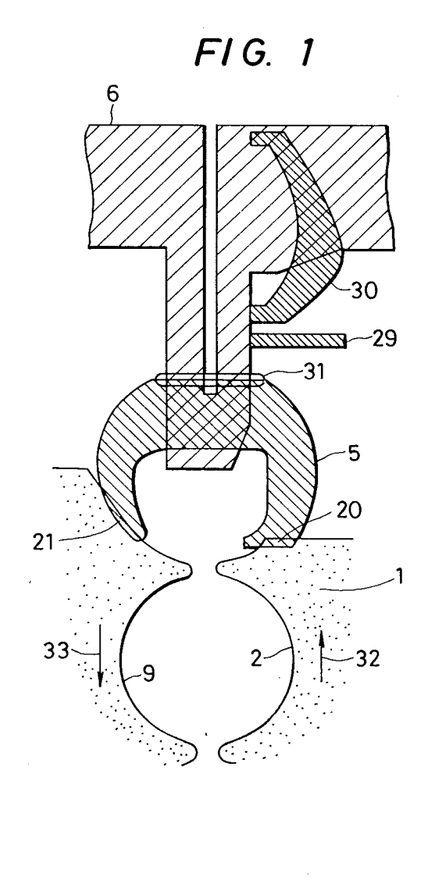
FIG. 1 is the first embodiment of the junctions of the ion-implanted tracks and soft magnetic tracks on the replicate gate corner pattern.

FIG. 1 shows the first embodiment of the junctions provided in a hybrid magnetic bubble memory device in which magnetic bubble propagation tracks formed of an ion-implanted layer and magnetic bubble propagation tracks formed of soft magnetic patterns. In the figure, 2 is the ion-implanted tracks which compose the greater part of the minor loop. In the region 1, ions such as $H_2^+$, $He^+$ or $Ne^+$ are implanted to form in-plane magnetized layer which drive bubbles. On the corner soft magnetic pattern 5, a hairpin type conductor pattern 6 is superposed to compose a replicate gate.

In the regions excluding the junctions 20, 21, a soft magnetic pattern is arranged on a non-ion-implanted region. In the junctions 20, 21, the soft magnetic pattern 5 constituting laid to overlap each other. A hairpin conductor 6 is laid to overlap the ion-implanted region 1 and the non-ion-implanted region. The soft magnetic patterns 29, 30 have the functions of transferring the bubbles, which are divided by the replicate gate, to a read major line.

The magnetic bubble transferred through an ion-implantation transfer passage of a minor loop in the direction 32 enters the soft magnetic pattern 5 at a junction 20 of type I which is formed of the overlappin portions of the ion-implanted transfer passage 2 and soft magnetic pattern 5. This magnetic bubble is stretched at the upper side of the soft magnetic pattern 5 into a strip domain as shown in FIG. 1. During this time, a pulsed current is applied so that the magnetic field generated inside the hairpin conductor 6 is in the direction in which a bias magnetic field is intensified. The pulsed field divides the magnetic bubble into two bubbles. One of the bubble is propagated into a read major line through the soft magnetic patterns 29, 30 and sent to a detector. The other bubble propagates to an ion-implantation track 33 on a type II junction on the left side of the soft magnetic pattern 5 to propagate in a minor loop.

As is mentioned above, the type I junction and type II junction are arranged at both ends of the replicate gate corner soft magnetic pattern. This enables the number of soft magnetic patterns in the vicinity of the replicate gate corner to reduce from ten to one as compared with the case of the minor loop shown in FIG. 2. The number reduction of the soft magnetic patterns corresponds to the reduction of the minor loop length by about 144 $\mu$m since the period of the soft magnetic patterns is around 16 $\mu$m. Accordingly, if a tri-folded minor loop is used with the minor loop bit number and the period of the ion-implanted transfer passage set to 2049 and 3 $\mu$m, respectively, an about 7% increase of bit density can be achieved.

In hybrid magnetic bubble memory devices, the ion-implantation tracks in a minor loop consist of a folded structure, which is disclosed in Japanese Laid-Open Patent Application No. 5491/1985, so as to increase the volume and period of the soft magnetic patterns in the corners and junctions.

The bubble propagation characteristics at the type I and II junctions are also improved in the embodiment. The soft magnetic patterns in conventional junctions shown in FIGS. 2 and 3 are formed by superposing the soft magnetic patterns for the straight line propagation of the bubble on and ion-implantation tracks. Therefore, the form of the soft magnetic patterns is restricted so as to improve the bubble propagation characteristics of a gap between adjacent soft magnetic patterns.

The junctions design on the corner soft magnetic patterns have no gaps among them, so that there is no restriction of the form of the soft magnetic patterns for the purpose of improving the gap propagation characteristics.

Figure 4:
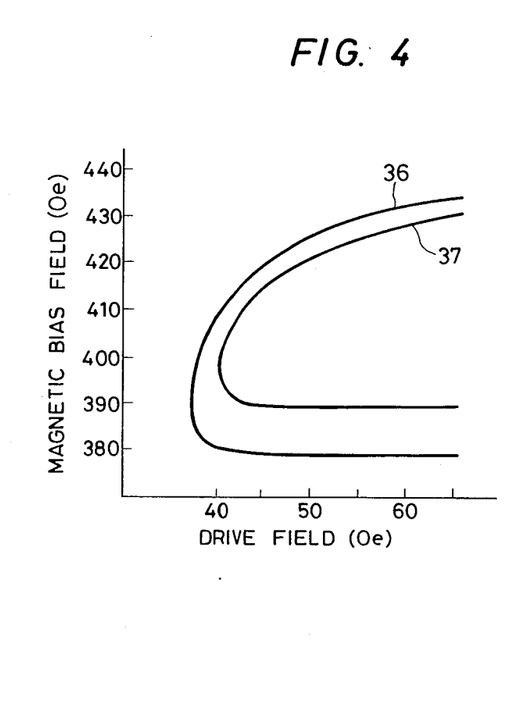
FIG. 4 is a graph showing the bubble propagation bias margin dependence on drive field strength for the conventional junctions and the junctions of the present invention.

The radius of curvature of pole in which a bubble is propagated is generated, of a corner soft magnetic pattern can be set smaller than that of soft magnetic patterns in conventional type I and type II junctions. Therefore, since the area of the portion in which the attractive pole is generated can be smaller the lower end of bias magnetic field of bubble propagation on the junctions and the soft magnetic patterns in the present invention have values lower than those of conventional junctions and soft magnetic bubble propagation patterns. A comparison between the propagation characteristics of a bubble of 0.9 $\mu$m in diameter in the junctions and those of the same bubble in corner soft magnetic patterns is shown in FIG. 4. According to a curve 36 obtained in the system of the present invention in comparison with a curve 37 obtained in a conventional system, the lower end of the bubble propagation bias magnetic field margin is about 10 $\overline{\text{Oe}}$ lower. The upper end of the margin is 5–10 $\overline{\text{Oe}}$ higher at 50 $\overline{\text{Oe}}$ drive field.

EXAMPLE 2

Figure 5:
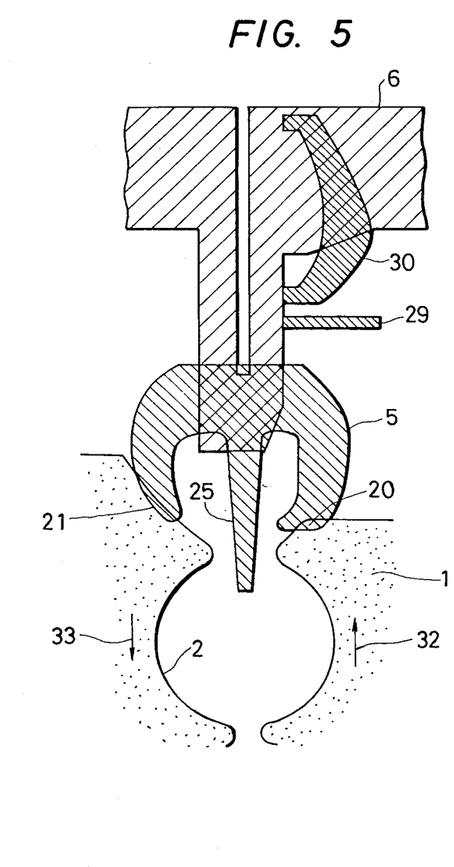
FIG. 5 is the second embodiment of the junctions of the ion-implanted tracks and soft magnetic tracks on the replicate gate corner pattern.

FIG. 5 is a schematic view showing the structure of the second embodiment of the junctions according to the present invention.

In the second embodiment, the pickax type corner soft magnetic pattern 5, having a tail 25 is used to improve bubble propagation characteristics and replicate gate characteristics.

EXAMPLE 3

Figure 6:
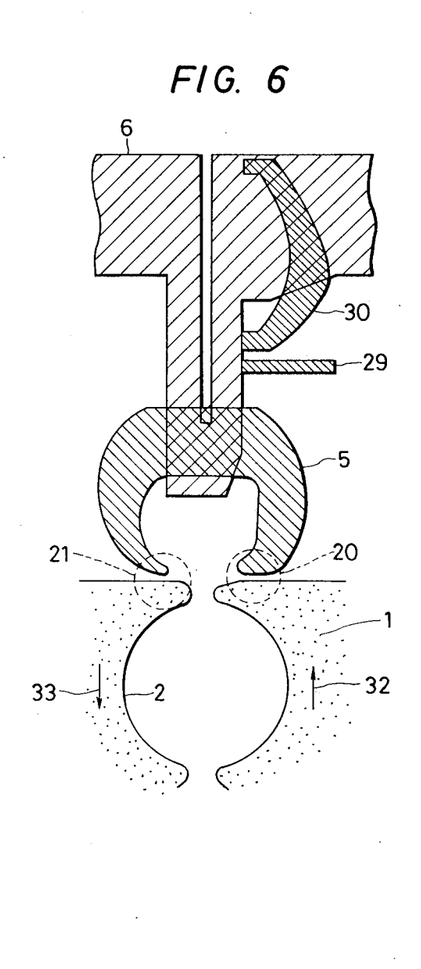
FIG. 6 is the third embodiment of the junctions of the ion-implanted tracks and soft magnetic tracks on the replicate gate corner pattern.

FIG. 6 is a schematic view showing the structure of the third embodiment of the junctions according to the presen invention.

In the third embodiment, the soft magnetic pattern form and the ion-implanted track form are almost the same with the first embodiment.

Figure 7:
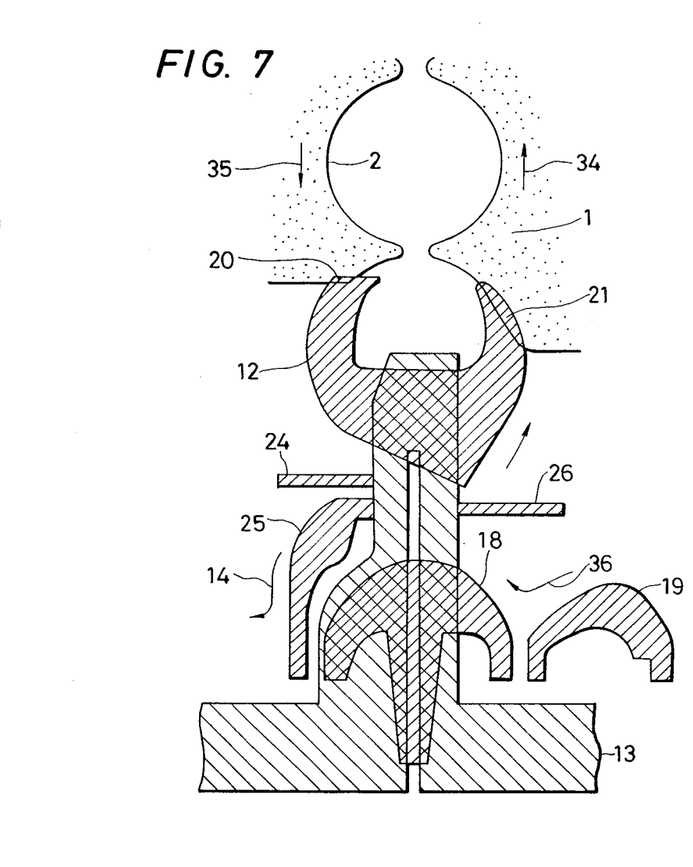
FIG. 7 is the fourth embodiment of the junctions of the ion-implanted tracks and soft magnetic tracks on the swap gate corner pattern.

At the junctions, the soft magnetic pattern is not superposed on the ion-implanted regions, as shown in FIG. 7. The distance between the soft magnetic pattern edge to the ion-implantation edge is not less than 0.5 $\mu$m and not larger than 2 $\mu$m to have good bubble propagation characteristics.

EXAMPLE 4

FIG. 7 is a schematic view showing the structure of the fourth embodiment of the junctions according to the present invention.

In the fourth embodiment, the present invention is applied to the swap gate corner in the minor loop. In the figure, 2 is the ion-implanted tracks which compose the greater part of the minor loop. In the region 1, ions such as $H_2^+$, $He^+$ or $Ne^+$ are implanted to form in-plane magnetic layer which drive bubbles. In the regions other than junctions 20, 21 the soft magnetic patterns are disposed in the non-implanted region. In junctions 20, 21 the soft magnetic pattern 12 that composes a swap gate corner is superposed on the ion-implanted region 1. Other soft magnetic patterns, 18, 19, 24, 25, 26 with the corner pattern 12 and hairpin conductor pattern compose the swap gate. Soft magnetic patterns 18, 19 and 25 also compose the write major bubble propagation line.

Bubbles propagated along the ion-implanted tracks 35 are transferred to the corner soft magnetic pattern 12 at the type I junction 20 composed df the superposition of the ion-implanted track 2 and the corner soft magnetic pattern 12. Bubbles are propagated on the corner pattern to reach the type II junction 21 where bubbles are transferred to the ion-implanted tracks 2 from the soft magnetic pattern 12. Pulsed current drive of the hairpin conductor 13, when the bubble 20 is on the corner pattern 12, performs the swap operation in which the bubble in the minor loop is transferred to the write major line and the bubble on the write major line is transferred to the minor loop at the same time. The bubble in the minor loop is propagated from the corner pattern 12 to write major line through the bar pattern 24 and the pattern 25 by pulsed current drive of the hairpin conductor 13. The bubble on the major line is propagated from the soft magnetic pattern 19 to the corner pattern 21 through pickax pattern 18 and the bar pattern 26 by pulsed current drive of the hairpin conductor 13.

As is mentioned above, at both ends of the swap gate corner soft magnetic pattern 18, the type I junction and the type II junction is located to realize the number reduction of the soft magnetic patterns from 9 to 1. The reduction effect of the minor loop length in the embodiment is almost the same with the embodiment 1 to 3 as mentioned above.

Bubble propagation characteristics at the type I and type II junctions 20, 21 are also improved in the embodiment.

The reason and the effect of the improvement is almost the same with the embodiment 1 as shown above and in the FIG. 4.

EXAMPLE 5

Figure 8:
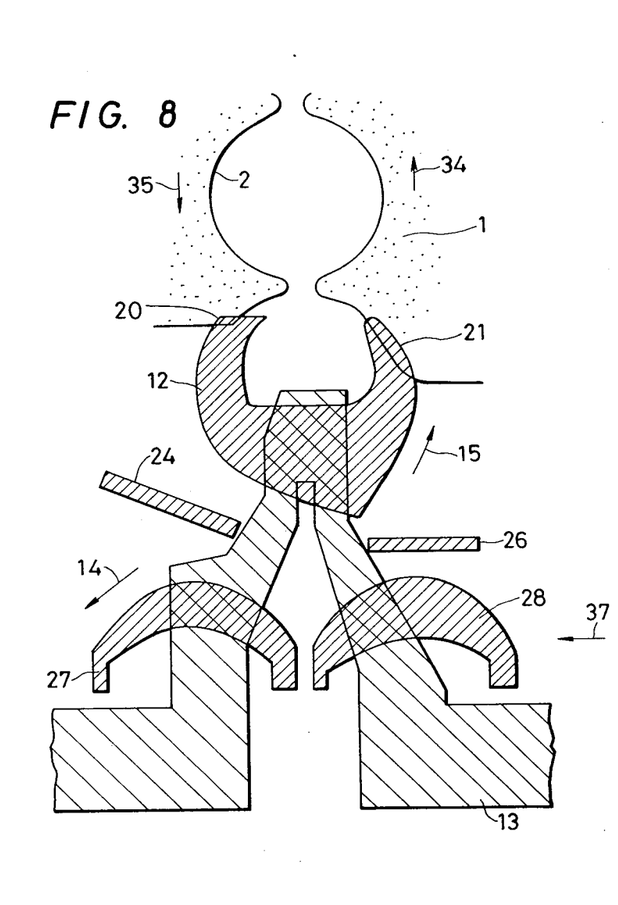
FIG. 8 is the fifth embodiment of the junctions on the swap gate corner pattern.

FIG. 8 is a schematic view showing the structure of the fifth embodiment of the junctions according to the present invention.

In the fifth embodiment, the present invention is applied to the different type swap gate corner from the fourth embodiment. The write major line is composed of Asymmetric chevron type soft magnetic patterns 27 and 28.

Other soft magnetic patterns 12, 24 and 26 and ion-implanted tracks 2 are almost the same with the fourth embodiment. The form of the hairpin conductor 13 is changed from the one in the fourth embodiment. The characteristics of bubble propagation and the swap gate operation are almost the same with the fourth embodiment.

EXAMPLE 6

Figure 9:
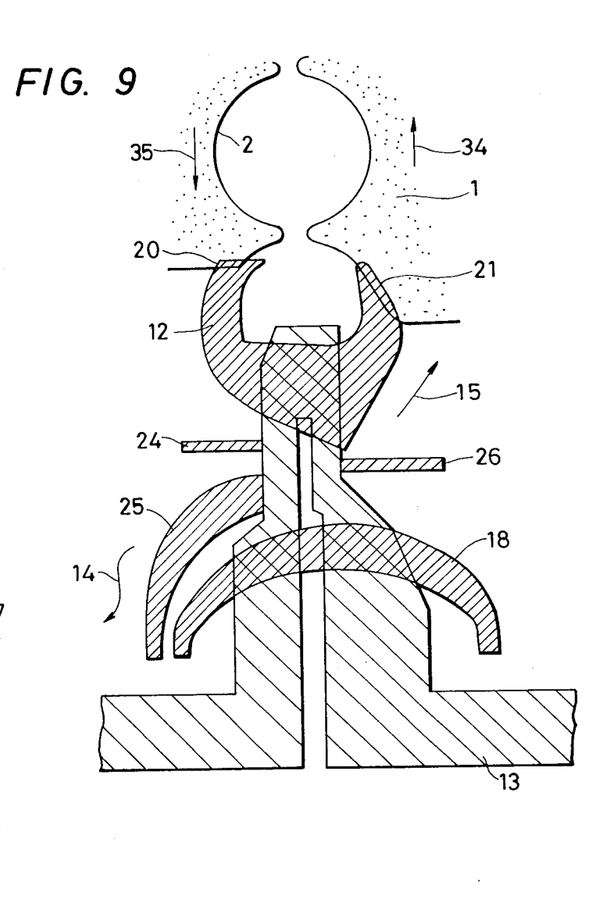
FIG. 9 is the sixth embodiment of the junctions on the swap gate corner pattern.

FIG. 9 is a schematic view showing the structure of the sixth embodiment of the junctions according to the present invention. In the sixth embodiment, the soft magnetic pattern period is almost the twice larger than the one in the fourth embodiment. In the sixth embodiment, bubbles are propagated on all bit positions of the write major line, which enables bubble write operation at the generator, for each cycle to realize high data rate write operation.

EXAMPLE 7

Figure 10:
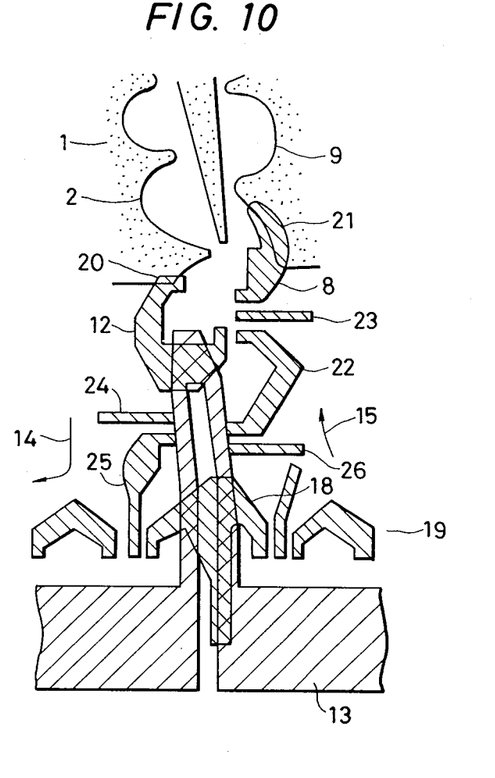
FIG. 10 is the seventh embodiment of the junctions on the swap gate corner pattern.

FIG. 10 is a schematic view showing the structure of the seventh embodiment of the junctions according to the present invention. In the seventh embodiment, the type I junction 20 is on the swap gate corner soft magnetic pattern 12 and the type II junction 21 is on the other soft magnetic pattern 21. The soft magnetic patterns 22, 23, 24, 25, 18 and 19, and the hairpin conductor pattern 13 is almost the same with the design shown in FIG. 3. In the seventh embodiment, swap gate characteristics change from the conventional swap gate as shown in FIG. 3 is smaller than fourth~sixth embodiment.

EXAMPLE 8

Figure 11:
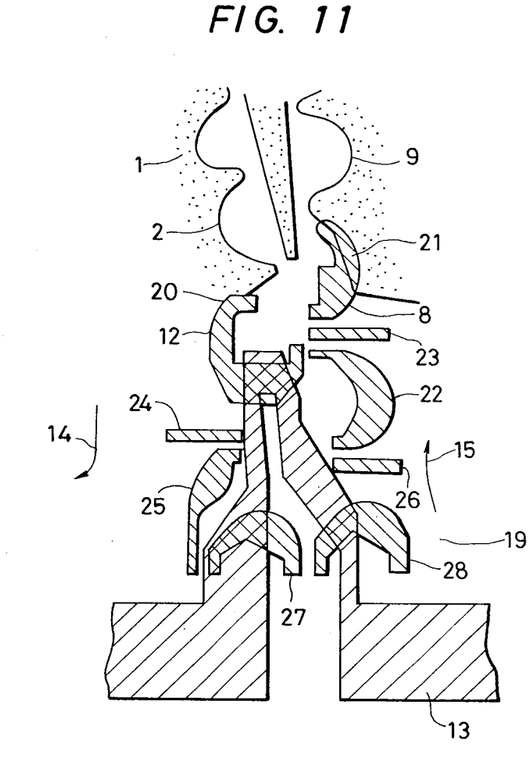
FIG. 11 is the eighth embodiment of the junctions on the swap gate corner pattern.

FIG. 11 is a schematic view showing the structure of the eighth embodiment of the junctions according to the present invention. In the eighth embodiment, the type I and the type II junctions 20, 21 and the corner soft magnetic patterns 12 are almost same with the seventh embodiment. The soft magnetic patterns 27 an 28 are different from the seventh embodiment. Asymmetric chevron patterns 27 and 28, and the hairpin conductor 13 is used, which patterns are close to the fifth embodiment.

As is evident from the foregoing explanation, according to the present invention, a high density hybrid magnetic bubble memory device is realized, which has small cell size ion-implantation tracks and functions composed of soft magnetic patterns and hairpin conductors having good bubble propagation characteristics. Such good characteristics is based on the present invention in which at least one of the type I or the type II junctions is on the corner soft magnetic patterns. The junctions also realize the chip size reduction.

What is claimed is:

1. A magnetic bubble memory device comprising:
   minor loop means for storing therein information, said minor loop means being composed of a first type magnetic bubble propagation means formed by implanting ions in a desired portion of a magnetic bubble film and a second type magnetic propagation means formed of a soft magnetic material pattern, said second type magnetic propagation means providing a minor loop corner where a bubble propagation direction on said first type magnetic bubble propagation means is changed, said minor loop corner having two ends respectively superposed on two ion-implanted regions composed of said first type magnetic bubble propagation means;
   major line means or major loop means for reading and writing information and being formed of soft magnetic material patterns;
   connecting means between said minor loop means and said major line means or said major loop means, said connecting means being composed of a part of said minor loop corner and at least one soft magnetic material pattern and being disposed in non-ion implanted-implanted region; and
   a hairpin conductor pattern superposed on/under said part of said minor loop corner where said part of said minor loop corner is disposed in a non-implanted region.

2. A magnetic bubble memory device according to claim 1, wherein said minor loop corner forms a part of a block replicate gate.

3. A magnetic bubble memory device according to claim 1, wherein said minor loop corner forms a part of a swap gate.

4. A magnetic bubble memory device according to claim 1, wherein said minor loop corner is a pickax.

5. A magnetic bubble memory device according to claim 1, wherein said minor loop corner is formed of only one soft magnetic material pattern.

6. A magnetic bubble memory device comprising:
   minor loop means for storing information therein, said minor loop means being composed of a first type magnetic bubble propagation means formed by implanting ions in a desired portion of a magnetic bubble film and a second type magnetic bubble propagation means formed of a soft magnetic material pattern, said second type magnetic bubble propagation means providing a minor loop corner whee a bubble propagation direction on said first type magnetic bubble propagation means is changed, said minor loop corner being disposed in a non-ion implanted region and having two ends respectively located at a predetermined spacing close to two ion-implanted regions composed of said first type magnetic bubble propagation means;
   major line means or major loop means for reading and writing information and being formed of soft magnetic material patterns;
   connecting means between said minor loop means and said major line means or said major loop means, said connecting means being composed of a part of said minor loop corner and at least one soft magnetic material pattern and disposed in a non-ion-implanted region; and a hairpin conductor pattern superimposed on/under said part of said minor loop corner.

7. A magnetic bubble memory device according to claim 6, wherein said hairpin conductor pattern is superposed on/under a part of said minor loop corner spaced from said two ends of said minor loop corner.

8. A magnetic bubble memory device according to claim 6, wherein said predetermined spacing of said two ends of said minor loop corner close to said two ion implanted regions is more than 0.5 μm and is less than 2.0 μm.

9. A magnetic bubble memory device according to claim 6, wherein said minor loop corner forms a part of a block replicate gate.

10. A magnetic buble memory device according to claim 6, wherein said minor loop corner is formed of only one soft magnetic material pattern.

* * * * *